(12) United States Patent
McKenna et al.

(10) Patent No.: US 6,184,063 B1
(45) Date of Patent: Feb. 6, 2001

(54) METHOD AND APPARATUS FOR BREAKING AND SEPARATING A WAFER INTO DIE USING A MULTI-RADII DOME

(75) Inventors: Robert G. McKenna, Houston; R. Scott Croff, Allen; Edwin L. Tom, Richardson, all of TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 08/975,378

(22) Filed: Nov. 20, 1997

Related U.S. Application Data

(60) Provisional application No. 60/031,616, filed on Nov. 26, 1996.

(51) Int. Cl.[7] ............................ H01L 21/44; H01L 21/48; H01L 21/50
(52) U.S. Cl. ........................ 438/113; 438/106; 438/110; 225/96; 225/104
(58) Field of Search .................................. 438/113, 110, 438/106, 225, 156, 134

(56) References Cited

U.S. PATENT DOCUMENTS

| 3,562,057 | 2/1971 | McAlister et al. . |
| 3,562,058 | 2/1971 | Boyd . |
| 3,565,306 | 2/1971 | Louis . |
| 3,677,875 | 7/1972 | Althouse . |
| 3,790,051 | 2/1974 | Moore . |
| 4,140,260 | 2/1979 | Gantley . |
| 4,296,542 | 10/1981 | Gotman . |
| 4,775,085 | 10/1988 | Ishizuka et al. . |
| 5,104,023 | 4/1992 | Nishiguchi et al. . |
| 5,227,001 | 7/1993 | Tamaki et al. . |
| 5,455,455 | * 10/1995 | Badehi . |
| 5,851,845 | * 12/1998 | Wood et al. . |
| 5,923,995 | * 7/1999 | Vao et al. . |

FOREIGN PATENT DOCUMENTS 0 289 045 A2  11/1988  (EP) .

* cited by examiner

Primary Examiner—Kevin M. Picardat
Assistant Examiner—D. Mark Collins
(74) Attorney, Agent, or Firm—Charles A. Brill; Wade James Brady, III; Frederick J. Telecky, Jr.

(57) ABSTRACT

A method and apparatus (10) for breaking a wafer (24) into die (26) having a high aspect ratio. In one embodiment, a multi-radii dome (12) is utilized to controllably break the wafer in two directions. The two different dome curvatures (R1, R2) provide an even, controlled, force along the kerfs in both the X-direction and the Y-direction. In another embodiment, a cylindrical dome (80) being curved (R3) in the Y-direction and flat in the X-direction is used to break a wafer into die having exceptionally high aspect ratios. The present invention reduces the likelihood of die fracture in the long dimension during the wafer break process. The wafer (24) is mounted on stretchable wafer tape (18) during the break process to prevent the die edges from contacting and rubbing with one another after the break process. The present invention allows separation of die of exceptionally large aspect ratios such as those having a 1:25 aspect ratio.

7 Claims, 5 Drawing Sheets

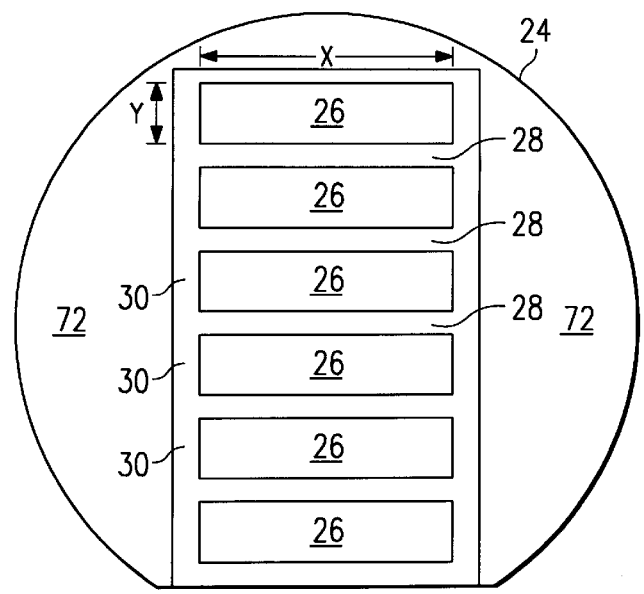
FIG. 2(b)
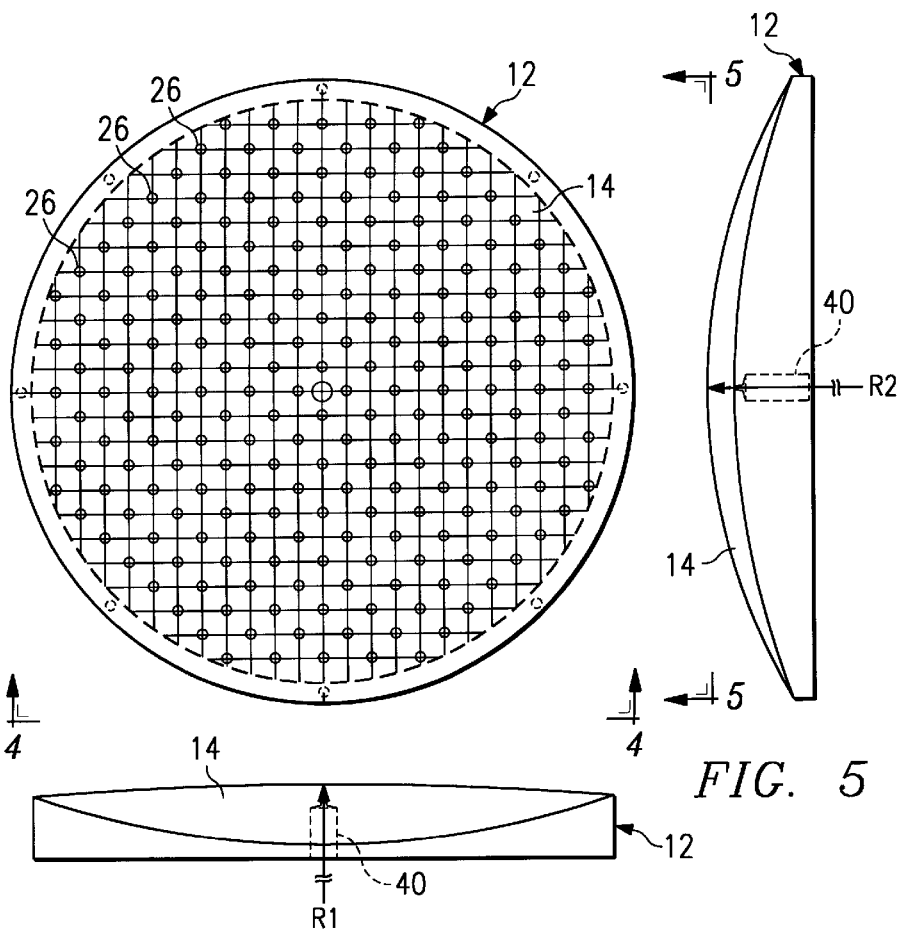
FIG. 3
FIG. 4
FIG. 5

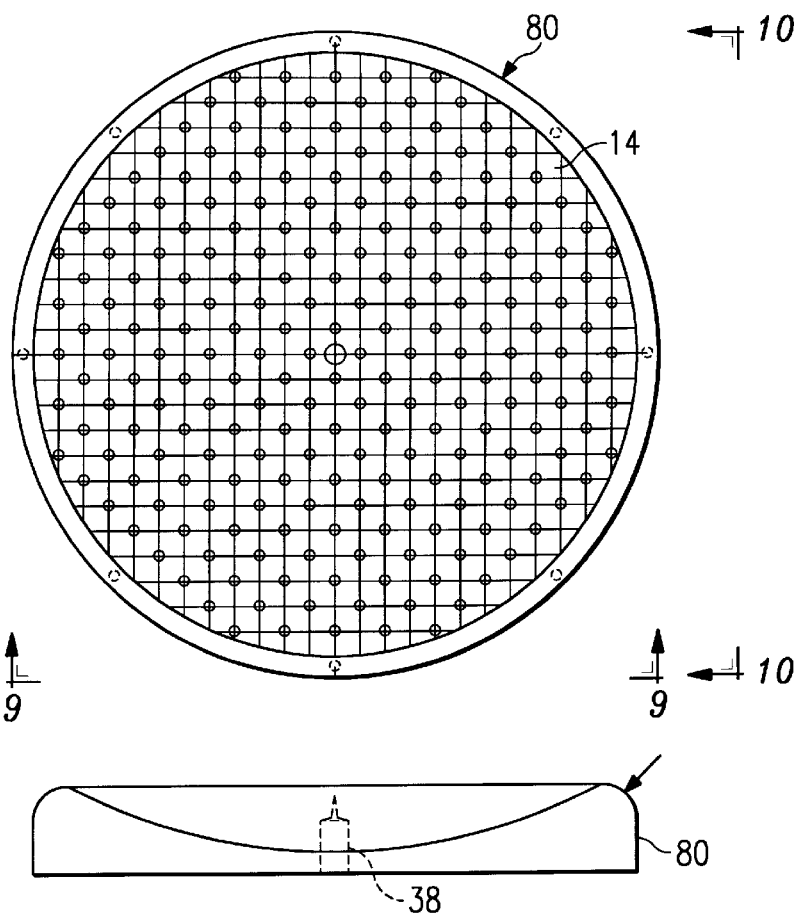
FIG. 8
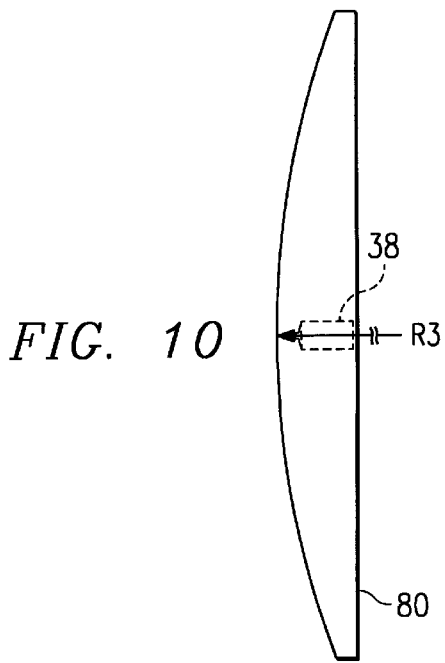
FIG. 9
FIG. 10

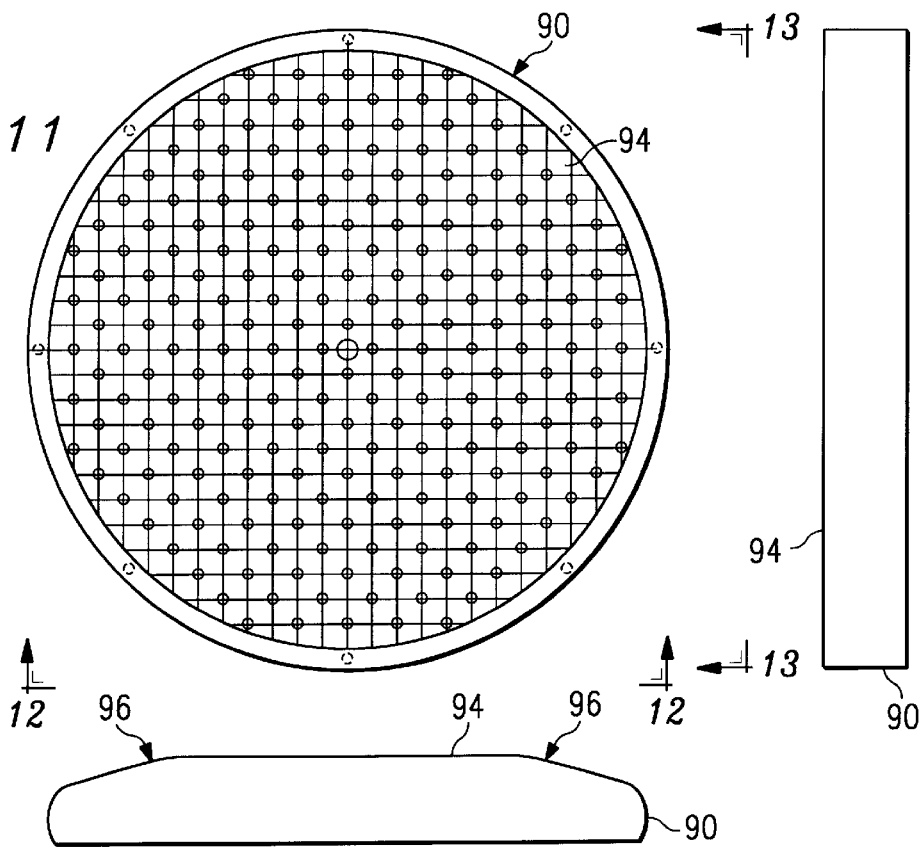
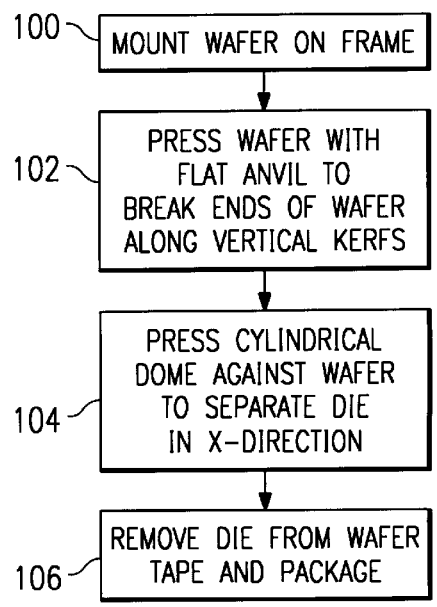

METHOD AND APPARATUS FOR BREAKING AND SEPARATING A WAFER INTO DIE USING A MULTI-RADII DOME

This application claims Benefit of Provisional Application Ser. No. 60/031,616 filed Nov. 26, 1996.

CROSS REFERENCE TO RELATED APPLICATIONS

Cross reference is made to the following commonly assigned co-pending patent applications, each being incorporated into the present application by reference.

| SERIAL NO. | TITLE | FILED |
|---|---|---|
| 08/367,970 | METHOD AND APPARATUS FOR BREAKING AND SEPARATING DIES FROM A WAFER | 01/03/95 |
| 08/485,168 | METHOD AND APPARATUS FOR BREAKING AND SEPARATING DIES FROM A WAFER | 06/07/95 |
| TI-23376 (Attorney's Docket #) | UV EXPOSURE OF STRETCHED UV-TAPE ON WAFER FRAMES TO ELIMINATE PREMATURE TAPE DELAMINATION FROM THE FRAME | HEREWITH |
| TI-24718 (Attorney's Docket #) | METHOD AND APPARATUS FOR STRETCHING SAW FILM TAPE AFTER BREAKING A PARTIALLY SAWN WAFER | HEREWITH |

TECHNICAL FIELD OF THE INVENTION

The present invention relates to the field of integrated circuits and wafer processing, and more particularly to methods and apparatus for breaking a semiconductor wafer into individual die including those having an exceptionally high aspect ratio.

BACKGROUND OF THE INVENTION

A cost effective way of fabricating integrated circuit die is to simultaneously form multiple circuits on a single semiconductor wafer and then break the wafer into die. This form of batch processing, or wafer processing, allows the cost of each step of the fabrication process to be spread among many devices and reduces the handling that would be required to process each device individually. A typical process flow includes many lithography, deposition, doping, etching, and testing steps. As the circuits are formed on the wafer, horizontally and vertically extending "streets" are defined in the wafer which extend between and separate the circuits from one another. These streets then may typically be scribed or partially sawn process to form kerfs. The wafer can then be broken along these kerfs to form the individual die which can then be packaged with leads.

When a micromechanical wafer is broken to form the individual die, care must be taken so as to minimize the generation of particles, and prevent the die edges from touching. Conventionally, the completed wafer is first placed on a flexible membrane or wafer stretch tape having an adhesive on one side to secure the wafer to the tape. This adhesive tape maintains the individual die in place as the dies are formed during the break process. Care must be taken to prevent the tape from shrinking back to the point where the die edges could touch one another and cause damage. This is especially critical for micromechanical devices having moving parts.

Conventionally, the die formed on a wafer are generally square, or slightly rectangular and thus have a low aspect ratio. That is, the length of the die sides are about equal and the aspect ratio approaches 1:1. These generally square die can thus be separated using many conventional techniques. One such technique is shown in commonly assigned U.S. Pat. No. 3,562,057. A spherical dome can be driven downward against the backside of the wafer to cause the wafer to break along the intersecting kerfs and form individual die. A spherical dome is appropriate when the dies are generally square, that is, having a low aspect ratio. Another similar device is shown in U.S. Pat. No. 5,104,023 whereby a hemispherical body presses a wafer against a resilient rubber mat. Such a device breaks the wafer along the kerfs in both directions from the wafer center outward, that is, such that cracking of the wafer is initiated from a center thereof towards the periphery thereof.

However, such hemispherically shaped domes are unsuitable for separating wafer die that have a high aspect ratio, such as rectangular spatial light modulators used in display systems, and exceptionally elongated die used in printer systems. Such systems incorporating elongated die are shown in commonly assigned U.S. Pat. No. 5,079,544 to DeMond, et al. entitled "Standard Independent Digitized Video System" and U.S. Pat. No. 5,105,369 to Nelson, entitled "Printing System Exposure Module Alignment Method and Apparatus of Manufacture", the teachings of each incorporated herein by reference. The spatial light modulator die used in the display system typically has an aspect ratio of 9:16. The die used in the printer system is comprised of an integrated circuit formed as an exceptionally elongated array of micromirrors, having a length of about 5" and an aspect ratio of 1:25. Due to the extreme length of this die, especially in view of the short width, this die can not be suitably separated from the other dies of a wafer using a spherically shaped dome as the die would fracture in the long direction. A plurality of elongated dies formed on a wafer for displays and printers is shown in FIG. 2(a) and FIG. 2(b), respectively, of the present application.

It is desired to provide a method and apparatus to be used for breaking die having a high aspect ratio, ie. those being rectangular rather than square, without fracturing the die in the long dimension during the breaking process. Such a method and apparatus should reduce the generation of silicon particles during wafer break while preventing the die edges from rubbing with one another during and after the break.

SUMMARY OF THE INVENTION

The present invention achieves technical advantages as a wafer break method and apparatus using a multi-radii domed anvil having a first radii in the X-direction and a second radii in the Y-direction. The radius of curvature in the X-direction typically has a larger radii and is used to break the wafer and separate the die along the longer sides. The dome radius of curvature in the Y-direction is smaller than the radius of curvature in the X-direction, and is used to break the wafer into die along the short sides of the die. The two different radii of curvature evenly concentrate the breaking forces down the kerfs in 2 different directions, independently. In an alternative embodiment, the anvil is curved in the X-direction and flat in the Y-direction, and is thus a cylindrical dome.

The method of the invention comprises mounting the wafer having integrated circuits formed thereon onto a flexible membrane or wafer tape. The membrane supporting the wafer is inverted, and a multi-radii wafer dome is pressed against the membrane proximate the underside of the wafer such that the dome larger radii along the X-direction is aligned with the elongated sides of the circuits. The X-Y axis of the dome is precisely aligned with the X-Y axis of the wafer. By pressing the dome against the wafer in this orientation, the breaking forces are evenly directed down the kerfs to break the wafer along the streets in both the X and Y directions. The tape is stretched by the dome while applying a vacuum thus forcing the tape to conform to the surface of the dome, ensuring that all die are broken. This stretching insures that the die remain separated from one another while remaining on the tape after a wafer break. Subsequently, pick and place equipment is utilized to remove the die from the tape, and these die are packaged.

By using a break dome having different radii in the X and Y-direction, a single dome can be used to break a wafer into die having a moderately high aspect ratio, without accidentally fracturing the die in the long dimension. By controlling the direction and amount of the breaking force in the X and Y directions, independently, the break process reduces silicon particle generation, which is critical when manufacturing micromechanical devices. The wafer is broken in the inverted position, and any particles generated will fall downwardly and away from the die.

In an alternative embodiment, a cylindrical anvil that is flat (no curvature) in the X-direction and curved in the Y-direction is used to separate die having an exceptionally high aspect ratio, as shown in FIG. 2(b). The wafer ends are first broken away along the short ends of the elongated circuits with a custom anvil. Then, the cylindrical anvil is aligned such that the X-direction having no curvature is aligned with the long sides of the circuits. The anvil is pressed against the wafer, and wafer wraps around the anvil surface in the Y-direction and the circuits will separate in the X-direction, along the long sides, to form the die.

BRIEF DESCRIPTION OF THE DRAWING

FIG. 2A and FIG. 2B are top views of wafers to be broken having a plurality of integrated circuits with a high aspect ratio formed thereon;

FIG. 3 is a top view of an anvil having a multi-radii dome whereby the dome has different radii or radius of curvature in the X and Y-directions, this anvil used for breaking the wafer shown in FIG. 2(a);

FIG. 4 is a side view of the multi-radii dome taken along lines 4—4 in FIG. 3 illustrating the larger first radius of curvature in the X-direction;

FIG. 5 is a side view of the dome of FIG. 3 taken along lines 5—5 to illustrate the second smaller radius of curvature in the Y-direction;

FIG. 8 is top view of a cylindrical anvil according to an alternative preferred embodiment of the invention having a radius of curvature in the Y-direction and no curvature in the X-direction, this anvil for breaking the wafer shown in FIG. 2(b);

FIG. 9 is a side view of the anvil of FIG. 8 taken along lines 9—9 illustrating no radius of curvature in the X-direction;

FIG. 10 is a side view of the anvil of FIG. 8 taken along lines 10—10 illustrating a radius of curvature in the Y-direction;

FIG. 11 is atop view of a substantially flat anvil used for breaking the ends of the wafer in FIG. 2(b) before using the cylindrical anvil;

FIG. 12 and FIG. 13 are side views of the flat anvil of FIG. 11, and

FIG. 14 is a flow diagram for breaking the wafer of FIG. 2(b).

DETAIL DESCRIPTION OF THE PREFERRED EMBODIMENT

Figure 1:
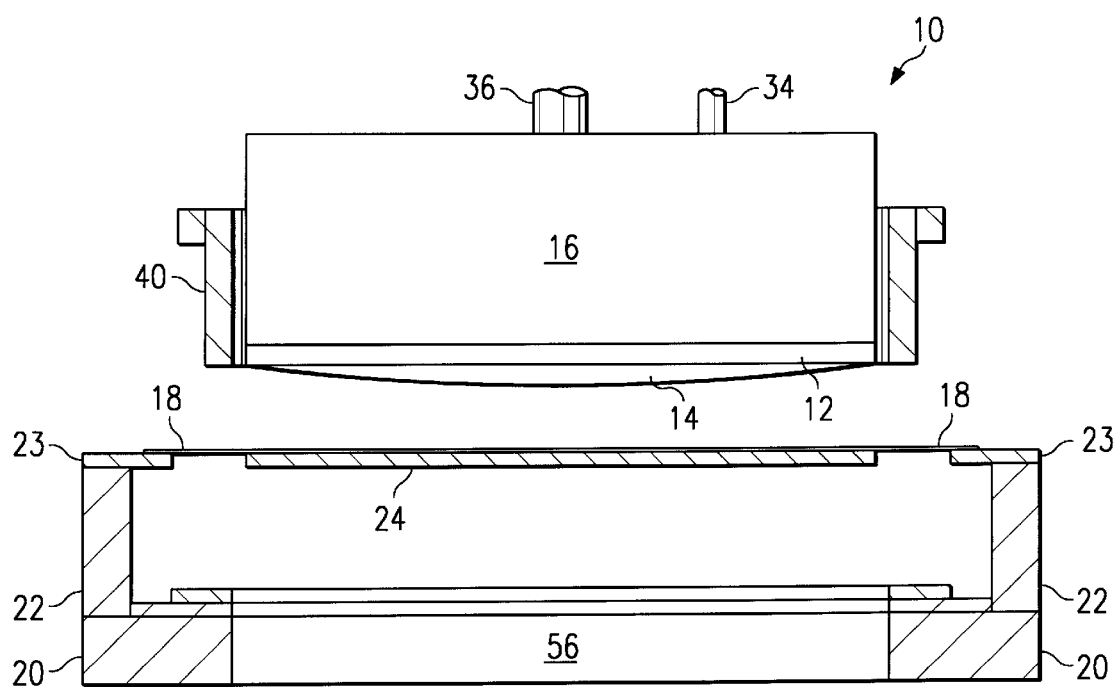
FIG. 1 is a cross sectional view of a wafer break apparatus including a multi-radii dome according to the preferred embodiment of the invention.

Referring now to FIG. 1, there is generally shown at 10 an apparatus for breaking a wafer having rectangular circuits into die according to the preferred embodiment of the present invention. Apparatus 10 is seen to include a multi-radii dome 12 having a dome surface 14 facing downwardly. A vertically extendable piston member 16 supports dome 12, whereby dome 12 is threadably attached to piston 16 to provide interchangability of the domes 12. An elastic membrane or wafer stretch tape 18 is seen to be stretched taut across a circular saw frame 23. Frame 23 and tape 18 are supported on and clamped to an upwardly extending annular sidewall 22 of a supporting frame 20. The bottom side of a fabricated wafer 24 to be broken into die is centrally securely attached to the adhesive side of tape 18 and is supported in the inverted position, as shown in FIG. 1.

Figure 2A:
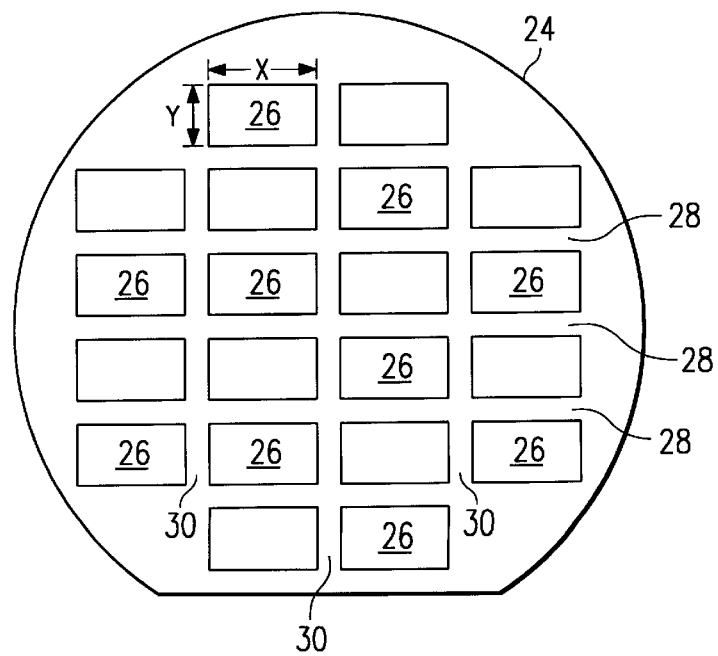

Referring to FIG. 2(a) and FIG. 2(b), wafer 24 is seen to be fabricated to have a plurality of elongated integrated circuits 26 having a high aspect ratio. That is, the length of the integrated circuits 26 in the X-direction is substantially longer than the width of the integrated circuits 26 in the Y-direction. The vertically and horizontally extending streets between the integrated circuits 26 are scribed or partially sawn to form kerfs and are shown at 28 and 30. Kerfs 28 extend in the X-direction between and along the elongated sides of the circuits 26. The streets 30 extend in the vertical direction between and along the shorter sides of the circuits 26. FIG. 2(a) illustrates circuits 26 having a moderate aspect ratio of, for example, 9:16 such as DMD's suitable for display systems. FIG. 2(b) illustrates circuits 26 having an exceptionally high aspect ratio, i.e. 1:25 such as 5" DMD die suitable for printer systems.

Additional discussion of the apparatus 10 is discussed in the co-pending cross-referenced applications identified as attorney's docket No. 08/975,029 TI-24718 and TI-23376, the teachings of each application incorporated herein by reference.

Referring back to FIG. 1, piston 16 has a cavity therewithin (not shown), this cavity being connected to a vacuum feed line 34 for applying a vacuum therewithin as the anvil surface 14 breaks the wafer. A piston rod 36 connected to piston 16 vertically and rotationally orients the dome 12 so that the X-Y axis of dome 12 is precisely aligned with the X-Y axis of the wafer 24. Precision alignment is necessary to insure the breaking force provided by dome 12 is evenly concentrated down the kerfs 28 and 30 in both the X-Y direction to avoid fracture of the die.

Referring to FIG. 3, there is shown a face view of the multi-radii dome 12 of FIG. 1. The face 14 of dome 12 is seen to have formed therein a plurality of holes 26 extending through the dome and communicating with the cavity (not shown) within member 16. These holes 26 are formed in a matrix and close to one another to maintain uniform negative pressure to pull and maintain the tape 18 against the dome surface 14 during the break process. Referring to FIG. 4, there is shown a side view of dome 12 taken along lines 4—4 in FIG. 3 to illustrate the large radius of curvature (R1) of the dome in the X-direction, such as 32". Likewise, FIG. 5 illustrates the side view of dome 12 taken along lines 5—5 in FIG. 3 along the Y-direction, illustrating a shorter radius of curvature (R2) such as 9". A threaded recess 40 is provided in the backside of dome 12 to threadable receive a threaded stud (not shown) forming a portion of member 16 to facilitate the attachment of dome 12 thereto.

Figure 6:
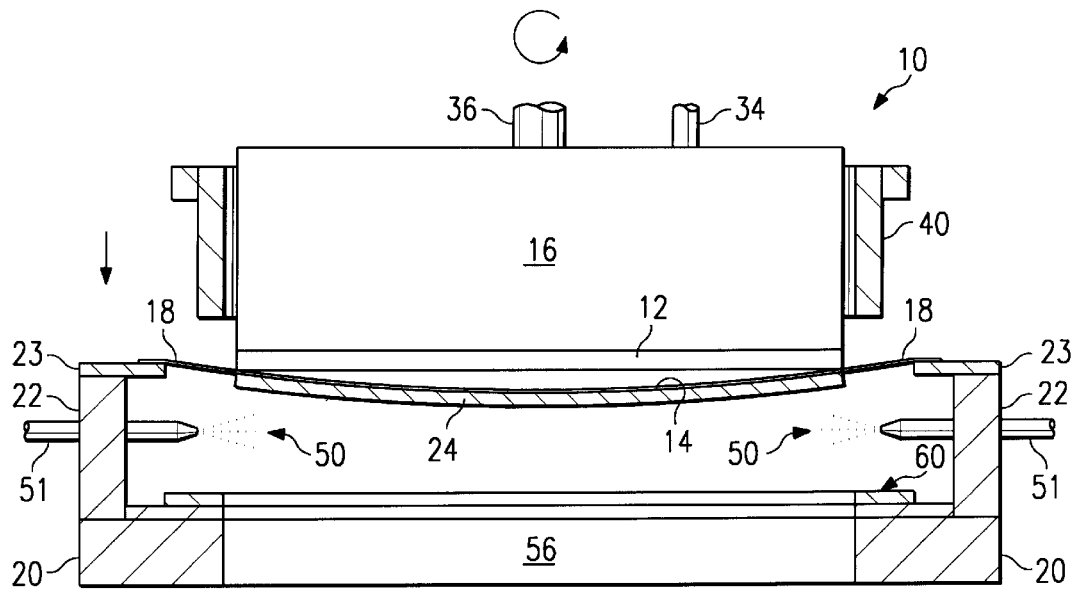
FIG. 6 is an illustration of the dome of FIG. 3 being pressed against the back side of the inverted wafer to break the wafer at the saw kerfs along the sides of the circuits.

Referring now to FIG. 6, there is shown the first step of the method for utilizing the multi-radii dome 12 of apparatus 10 to break the fabricated wafer 24 into individual die having a high aspect ratio. As shown in FIG. 6, the multi-radii dome 12 is supported over the tape 18 proximate the backside of wafer 24. The X-Y axis of dome 12 is precisely aligned with the X-Y axis of the wafer 24. The multi-radii dome 12 is then urged downwardly by piston 16. The face 14 of dome 12 engages the membrane/tape 18 such that the larger radius of curvature R1, shown in FIG. 4, of the dome 12 is aligned with the kerfs 28 extending in the X-direction between the long sides of the circuits 26, and the smaller radius of curvature R2, shown in FIG. 5, of the dome 12 is aligned with the kerfs 30 extending in the Y-direction, shown in FIG. 2(*a*). As dome 12 is urged downwardly, the wafer 24 will break along both kerfs 28 and the kerfs 30 extending along the sides of the circuits 26. The two radius of curvature of dome 12 provide a custom and even force to the backside of wafer 24 to cause the wafer to break along the kerfs 28 and 30 as the tape/wafer is wrapped around the curvature of dome 12. The larger radius of curvature R1 supports the die in the long direction to cause the wafer to break along kerfs 30 in the X-direction. The smaller radius of curvature R2 supports the die in the short direction to cause the wafer to break along kerfs 28 in the Y-direction.

During this break process, the individual die are formed, whereby the tape 18 is sufficiently stretched by dome 12 to prevent the corners of the circuits 26 from rubbing against one another. Since the die are broken in the X and Y-directions with independent, controlled forces directed down the kerfs, a reduced number of silicon particles are generated during the wafer break process, and the likelihood of fracture of the die is reduced. Since the wafer is in the inverted position during the wafer break process, these particles will fall downwardly into the wafer supporting frame 20. Ionized gas 50 is directed by nozzles 51 across the surface of wafer 24, as the flexible tape 18 is stretched over the surface 14 of dome 12. The ionized gas 50 prevents a static charge from developing on flexible tape 18, which static charge would attract and hold silicon particles on the surface of wafer 24. The gas and particles are exhausted via opening 56 of support frame 20. A negative pressure is applied to the tape 18 proximate wafer 24 via the holes 26 extending through dome 12, as shown in FIG. 3. This negative pressure helps maintain the tape in a fixed stretched position during the wafer break process.

Figure 7:
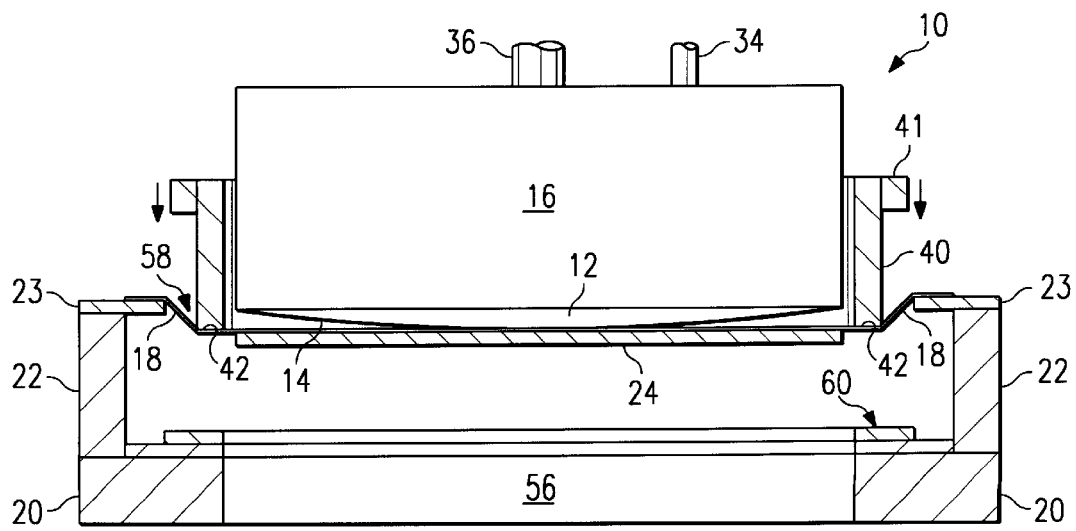
FIG. 7 illustrates an expander/transfer cylinder encompassing the multi-radii anvil being pressed against the tape proximate the broken wafer to stretch and remove the tape and broken wafer from both the dome and the larger frame prior to the transfer of the tape and broken wafer to a smaller saw frame.

Now referring to FIG. 7, after the wafer 24 has been broken along the kerfs 28 and 30 in both the X and Y-directions to form the individual die, an expander/transfer cylinder 40 encompassing the dome 12 is extended downwardly at flange 41 to engage the tape 18. A cylinder rim 42 first stretches the tape, then the rim 42 removes the tape and broken wafer from the dome 12. Cylinder 40 keeps the tape taut during transfer to maintain the die separated from one another. This expander cylinder 40 then further extends to transfer the tape 18 and broken wafer 24 to a smaller annular frame 60 securely positioned at the base of support frame 20, and the tape is removed from frame 23 by melting the tape with a heated resistance wire 58 extending around the outside edge of transfer frame rim 42. This frame 60, along with the broken wafer, is then inverted and advanced to pick and place equipment for packaging of the individual die. A more detailed description of the tape transfer is detailed in co-pending patent application attorney's docket No. 08/975, 029 TI-24718 the teachings of which are incorporated herein by reference.

In summary, by utilizing a multi-radii dome to break a wafer comprising integrated circuits having a moderately high aspect ratio, the wafer can be broken in two directions with two different, controlled, independent forces. The dome radius of curvatures R1 and R2 are selected to correspond to the aspect ratio of the die. The apparatus reduces the chance the die will fracture in the long direction, and reduces the amount and size of silicon particles generated during the wafer break process. These particles will drop downwardly as the wafer is broken in the inverted position, as shown in FIG. 1. By stretching the tape with the dome during the wafer break process, and utilizing a vacuum provided through the dome surface 14, the tape is maintained in the stretched position to avoid the die corners from engaging and rubbing against one another prior to removal of the devices from the tape for packaging.

Now referring to FIG. 8 there is shown an alternative embodiment of the present invention comprising a cylindrical dome 80 for breaking a wafer into die having an exceptionally high aspect ratio, such as 1:25 shown in FIG. 2(*b*). The cylindrical dome 80 has a large radius of curvature R3 in the Y-direction, and is flat in the X-direction, and thus an infinite radius of curvature. Referring first to FIG. 11, there is shown a basically flat anvil 90 having curved ends at the left side and the right side, this anvil 90 being used prior to use of anvil 80 to separate the segment ends 72 of wafer 24 along the vertically extending kerfs 30. Prior to use of the cylindrical dome 80, the anvil 90 is first placed in apparatus 10 and lowered against the backside of the wafer 24. The flat face 94 of anvil 90 supports the elongated circuits 26, while the curved shoulders 96 of anvil 90 cause the wafer sections 72 of wafer 24 to be wrapped around shoulders 96 to separate sections 72 along vertical kerfs 30. Thereafter, anvil 90 is removed from apparatus 10, and the cylindrical dome 80 is utilized.

Referring back to FIG. 8 in reference to FIG. 2(*b*), the cylindrical dome 80 is oriented during the break process such that the flat X-direction is aligned with the long direction of the circuits 26. The radius of curvature R3 in the Y-direction is aligned to be transverse to the length of the circuits 26 whereby the wafer 24 is wrapped about the cylindrical dome 80 in the Y-direction. Referring to FIG. 9, the cylindrical dome 80 has no radius of curvature in the X-direction and thus supports the elongated circuits along the length thereof. FIG. 10 illustrates the radius of curvature R3 of the cylindrical dome 80 in the Y-direction, and may have a radius of curvature of about 8", this radius of curvature being suitable to and a function of the width of the circuits 26 formed on wafer 24. Referring to FIG. 2(*b*), for elongated die having a width of about 0.2", a radius of curvature R3 of 8" for cylindrical dome 80 is suitable. However, if the width of the devices 26 is increased or decreased, the radius of curvature R3 of the cylindrical dome 80 in FIG. 8 would be increased or decreased as well, respectively. The curvature R3 is chosen to support the circuits 26 in the Y-direction while causing the horizontal kerfs 28 to fracture. In summary, the radius of curvature R3 in the Y-direction is chosen to be commensurate with the width of the devices 26 to be separated from one another.

A two step process is required for separating the wafer into die having an exceptionally high aspect ratio, such as those shown in FIG. 2(b). This is because the lengthy circuits 26 need to be maintained supported in the X-direction to avoid fracture while breaking the wafer along horizontally extending kerfs 28. The only necessary vertical breaking of the wafer is achieved using the separate flat anvil 90 to separate the sections 72 along the vertically extending kerfs 30. The X and Y axis of the cylindrical anvil 80 are precisely aligned with the X and Y axis of the wafer 24. Again, this provides an even controlled force down the length of the laterally extending kerfs 28 as the wafer is wrapped around the cylindrical anvil 80 in the Y-direction. This controlled breaking force minimizes the generation and size of particles created as the wafer breaks along the kerfs.

Referring now to FIG. 14, there is shown the method of utilizing the cylindrical dome 80 of the alternative preferred embodiment of the present invention. At step 100, the processed wafer 24 is placed on the elastic tape or membrane 18 which is mounted to wafer frame 23 and mounted across wafer supporting frame 20. At step 102, the flat anvil 90 is mounted on piston 16 and lowered against the backside of the inverted wafer such that the wafer ends 72 are wrapped around shoulders 96, causing the wafer ends 72 to separate along vertically extending kerfs 30. At step 104, the flat anvil 90 is removed and replaced with the cylindrical anvil 80 shown in FIG. 8. The cylindrical dome 80 is pressed against the inverted wafer such that the flat dimension of the anvil extends along the laterally extending kerfs 28. As the cylindrical dome 80 is pressed against the inverted wafer, the wafer is wrapped around the cylindrical anvil in the Y-direction, causing the wafer to break along the laterally extending kerfs 28, thus forming the separated die. The flat extension of the cylindrical dome in the X-direction supports the substantial length of the circuits 26 as the wafer is separated along the kerfs 28 extending therebetween.

At step 106, the dome 80 is retracted from the partially broken wafer 24 and the tape 18. The broken wafer supported upon tape 18 is transferred by expander cylinder 40 to the smaller wafer frame 60 for subsequent processing, including removing the die from the tape for packaging.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. An apparatus for separating a wafer into individual portions, comprising:
   a tape frame for holding a flexible membrane supporting a wafer; and
   an anvil having a convex surface for engaging said flexible membrane proximate said wafer, said anvil convex surface having a first radius of curvature in a first direction and a second radius of curvature in a second direction, said first radius being larger than said second radius.

2. The apparatus as specified in claim 1 wherein said first direction is perpendicular to said second direction.

3. The apparatus as specified in claim 1 wherein said first radius is substantially greater than said second radius.

4. The apparatus as specified in claim 3 wherein said first radius is at least twice as great as said second radius.

5. The apparatus as specified in claim 1 wherein said first direction is an X-direction and said second direction is a Y-direction.

6. An apparatus for separating a wafer into individual portions, comprising:
   a tape frame for holding a flexible membrane supporting a wafer; and
   a cylindrical anvil having an anvil surface for engaging said flexible membrane proximate said wafer, said anvil surface having a radius of curvature in a first direction and being flat in a second direction.

7. The apparatus as specified in claim 6 wherein said first direction is a Y-direction and said second direction is a X-direction.

* * * * *